United States Patent [19]
Date et al.

[11] Patent Number: 5,200,908
[45] Date of Patent: Apr. 6, 1993

[54] PLACEMENT OPTIMIZING METHOD/APPARATUS AND APPARATUS FOR DESIGNING SEMICONDUCTOR DEVICES

[75] Inventors: Hiroshi Date; Terumine Hayashi, both of Hitachi, Japan

[73] Assignee: Hitachi, Ltd., Tokyo, Japan

[21] Appl. No.: 533,540

[22] Filed: Jun. 5, 1990

[30] Foreign Application Priority Data

Jun. 8, 1989 [JP] Japan ................... 1-144123

[51] Int. Cl.$^5$ ............................................. G06F 15/60
[52] U.S. Cl. ................................... 364/491; 364/490; 364/489; 364/488; 395/21; 395/921
[58] Field of Search ............. 364/488, 489, 490, 491; 395/21, 22, 921

[56] References Cited

U.S. PATENT DOCUMENTS

| | | | |
|---|---|---|---|
| H354 | 10/1987 | Rubin ................... | 364/491 |
| 3,629,843 | 12/1971 | Scheinman ............ | 364/490 |
| 3,681,782 | 8/1972 | Scanlon ................. | 364/491 |
| 3,702,003 | 10/1972 | Ramirez, Jr. et al. ... | 364/489 |
| 4,577,276 | 3/1986 | Dunlop et al. ......... | 364/491 |
| 4,580,228 | 4/1986 | Noto ..................... | 364/491 |
| 4,593,363 | 6/1986 | Burstein et al. ........ | 364/491 |
| 4,719,591 | 1/1988 | Hopfield et al. ....... | 364/807 |
| 4,754,408 | 6/1988 | Carpenter et al. ..... | 364/491 |

FOREIGN PATENT DOCUMENTS 93760 4/1987 Japan .
243071 10/1987 Japan .
121978 5/1988 Japan .

Primary Examiner—Vincent N. Trans
Attorney, Agent, or Firm—Antonelli, Terry, Stout & Kraus

[57] ABSTRACT

A method of finding the optimal placement of circuit elements is disclosed in which the optimal position of each circuit element is determined from the results of arithmetic operations performed by a processor network where a plurality of processors are interconnected so as to form a neural network, and each processor takes in its own output and the outputs of all other processors to solve a problem.

25 Claims, 11 Drawing Sheets

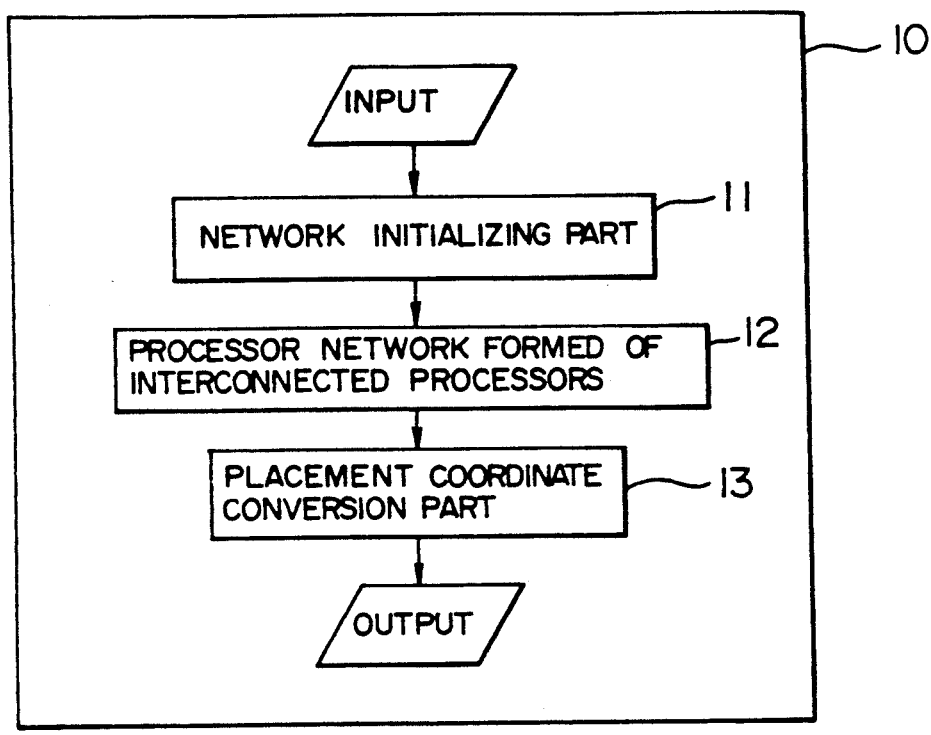
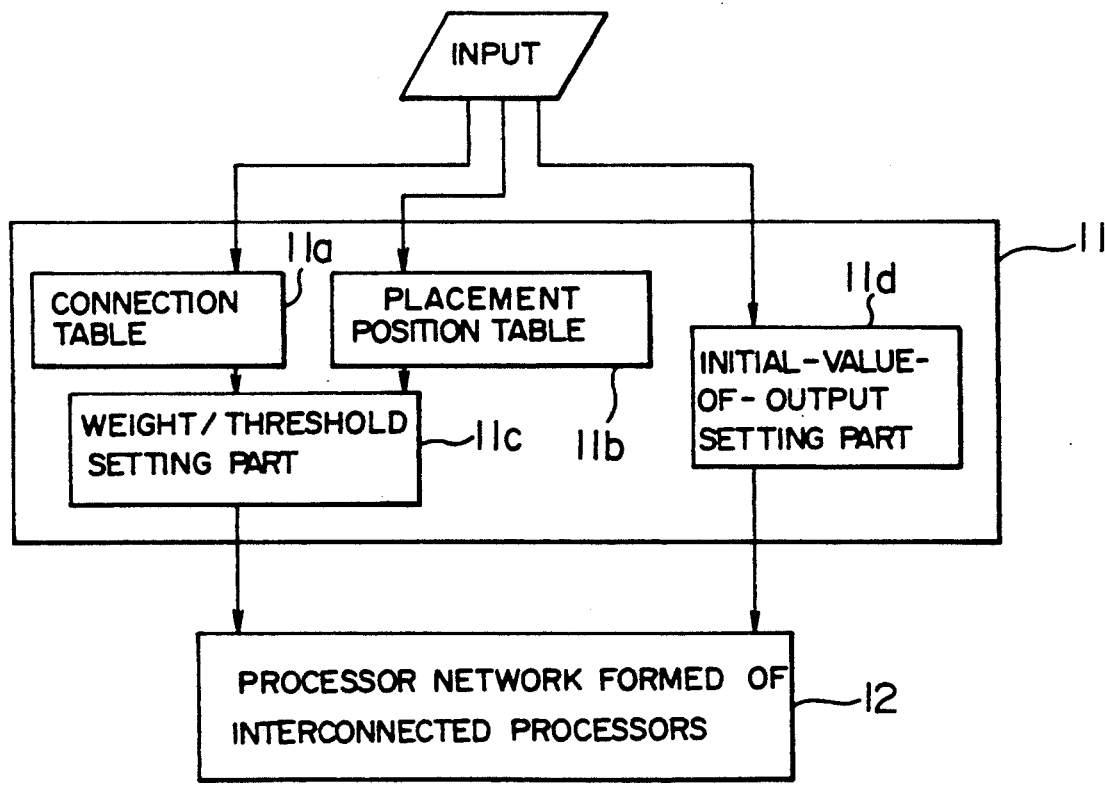

F I G. 4
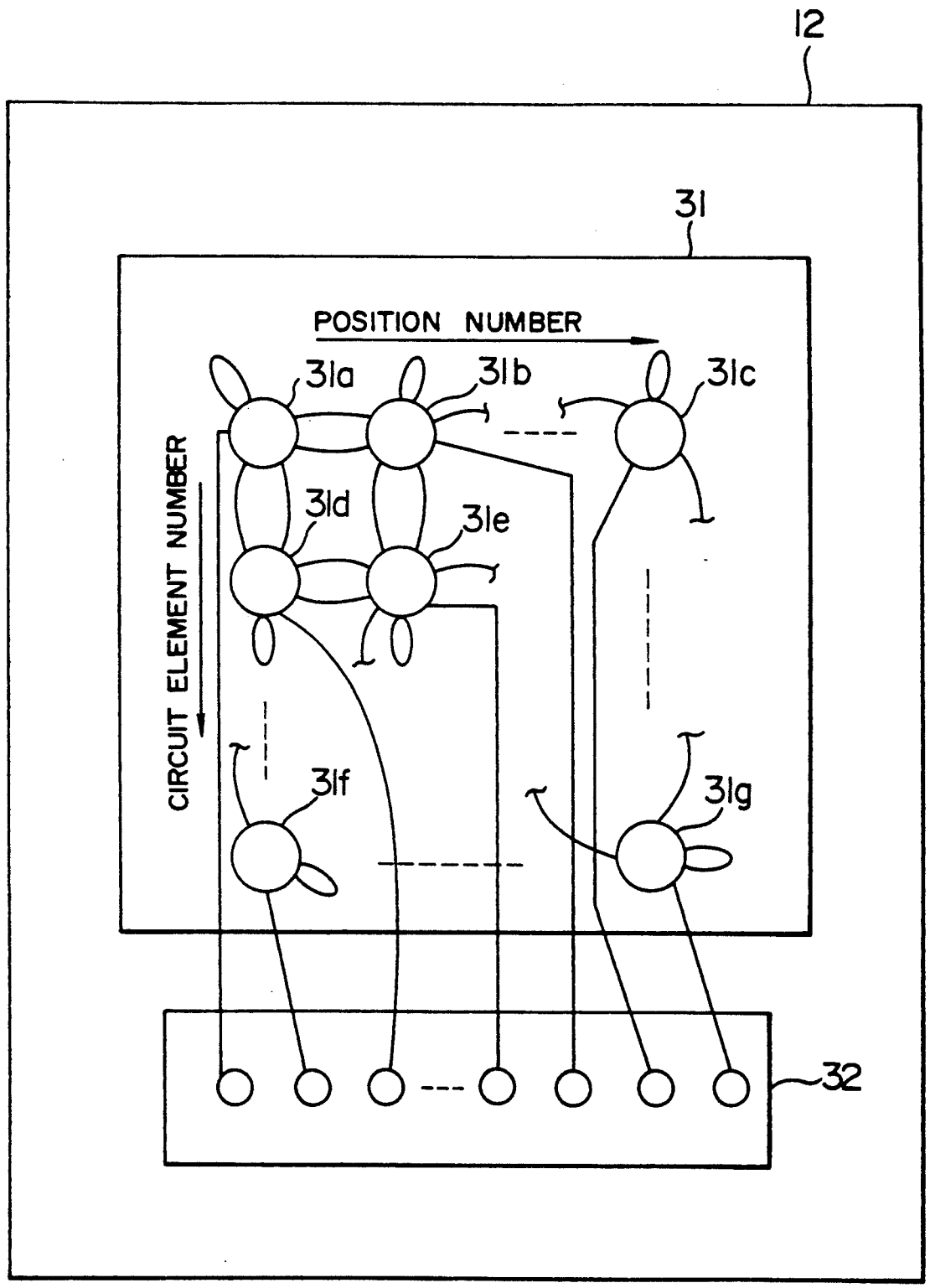

PLACEMENT OPTIMIZING METHOD/APPARATUS AND APPARATUS FOR DESIGNING SEMICONDUCTOR DEVICES

BACKGROUND OF THE INVENTION

The present invention relates to a method of and an apparatus for optimizing the placement of circuit elements on a substrate.

In a case where a multiplicity of circuit modules having correlation with one another are arranged on a single printed circuit board, or a multiplicity of circuits elements having correlation with one another are formed on a single semiconductor substrate to produce a semiconductor device such as a large scale integration circuit (LSI), it is necessary to determine the positions of the circuit modules or circuit elements so that an evaluation function has an optimal value (for example, the total wiring length among the circuit modules or circuit elements becomes shortest or the number of crossings of wiring conductors becomes minimum), thereby reducing manufacturing cost and improving an operation speed.

FIG. 1 is a flow chart showing the steps of a procedure used in the conventional iterative improvement method for finding the optimal placement. In a case where the optimal placement of circuit elements on an LSI is determined by the iterative improvement method, a value N indicating the number of repetitions of calculation is first set in step 1. Then, the initial positions of the circuit elements are set by using pseudo-random numbers (step 2). Next, a pair of circuit elements are selected from all the circuit elements (step 3). The manufacturing cost of the selected circuit elements for a case where the selected circuit elements exchange positions with each other, is calculated (step 4). It is checked whether or not the manufacturing cost is improved by the above exchange of positions (step 5). When it is judged that the manufacturing cost of the selected circuit elements is improved, that is, when it is judged in the step 5 that a value obtained by subtracting the manufacturing cost of the selected circuit elements prior to the exchange of positions from the manufacturing cost of the selected circuit elements which have exchanged positions with each other, is negative, the selected circuit elements exchange positions with each other (step 6), and then the processing in the step 3 is again carried out. When it is judged in the step 5 that the manufacturing cost of the selected circuit elements is not improved, the processing in step 7 is carried out. In the step 7, a value C indicative of the contents of a counter is incremented by one. In step 8, it is checked whether or not the value C is greater than the value N (which is set in the step 1). When the value C is not greater than the value N, the processing in the steps 1 to 7 is again carried out. When the value C is greater than the value N, the improved placement of circuit elements is delivered (step 9).

The prior art relating to the execution of the iterative improvement method by a digital computer of the parallel processing type, is disclosed in, for example, JP-A-62-93,760, JP-A-62-243,071 and JP-A-63-121,978.

Further, a related art of this kind is disclosed in a U.S. patent application Ser. No. 492,906 filed by the same assignee (U.S. Pat. No. 5,144,563) and corresponding to a Japanese patent application (Appl. No. 1-62,215).

As mentioned above, according to the conventional placement optimizing method, a pair of circuit elements are selected, and it is checked whether or not the manufacturing cost of the selected circuit elements is improved when the selected circuit elements exchange positions with each other, to find favorable placement of circuit elements. The favorable placement does not always mean the optimal placement, but may merely correspond to a local minimum of an energy function. In other words, it may be possible to improve the favorable placement.

Further, according to the conventional placement optimizing method, the number of arithmetic operations is exponentially increased as the circuit scale of an LSI or others is larger, and it is impossible to perform a vast number of arithmetic operatons in a short time.

Recently, it has been known that a neural network can be used to find a combination of optimal solutions, and models of the neural network have been proposed by Hopfield et al. (refer to U.S. Pat. No. 4,719,591).

SUMMARY OF THE INVENTION

It is an object of the present invention to provide a placement optimizing method/apparatus capable of solving an placement problem rapidly and precisely by using a neural network or the concept of neural network, and to provide an apparatus for designing semiconductor devices by using the placement optimizing method/apparatus.

In order to the attain the above object, according to the present invention, a processor network is used in which each of $n^2$ processors is applied with its own output and the outputs of all other processors to solve a problem, a processor having coordinate values (i, k) calculates a constraint variable for a case where the i-th circuit element (where i=1 to n) is placed at the k-th position (where k=1 to n), until the constraint variable satisfies a constraint condition, so that a circuit evaluation can have an optimal value, and the position of a circuit element allotted to a processor which delivers an output satisfying a constraint condition, is determined from the coordinate values of the processor.

In more detail, in a case where processors having coordinate values (i, 1), (i, 2) . . . (i, n) carry out the above calculation, when a processor having coordinate values (i, k) delivers an output equal to "1", the remaining processors having coordinate values (i, 1), (i, 2), . . . , (i, k−1), (i, k+1), . . . , (i, n) will deliver an output equal to "0". Accordingly, the i-th circuit element is placed at the k-th position to obtain the optimal placement.

BRIEF DESCRIPTION OF THE DRAWINGS

FIG. 2 is a block diagram showing the whole construction of an embodiment of a placement optimizing apparatus according to the present invention which embodiment is included in an apparatus for designing semiconductor devices;

FIG. 3 is a block diagram showing the construction of the network initializing part of FIG. 2;

FIG. 4 is a pictorial view showing the construction of the processor network of FIG. 2;

DESCRIPTION OF THE PREFERRED EMBODIMENTS

Figure 1:
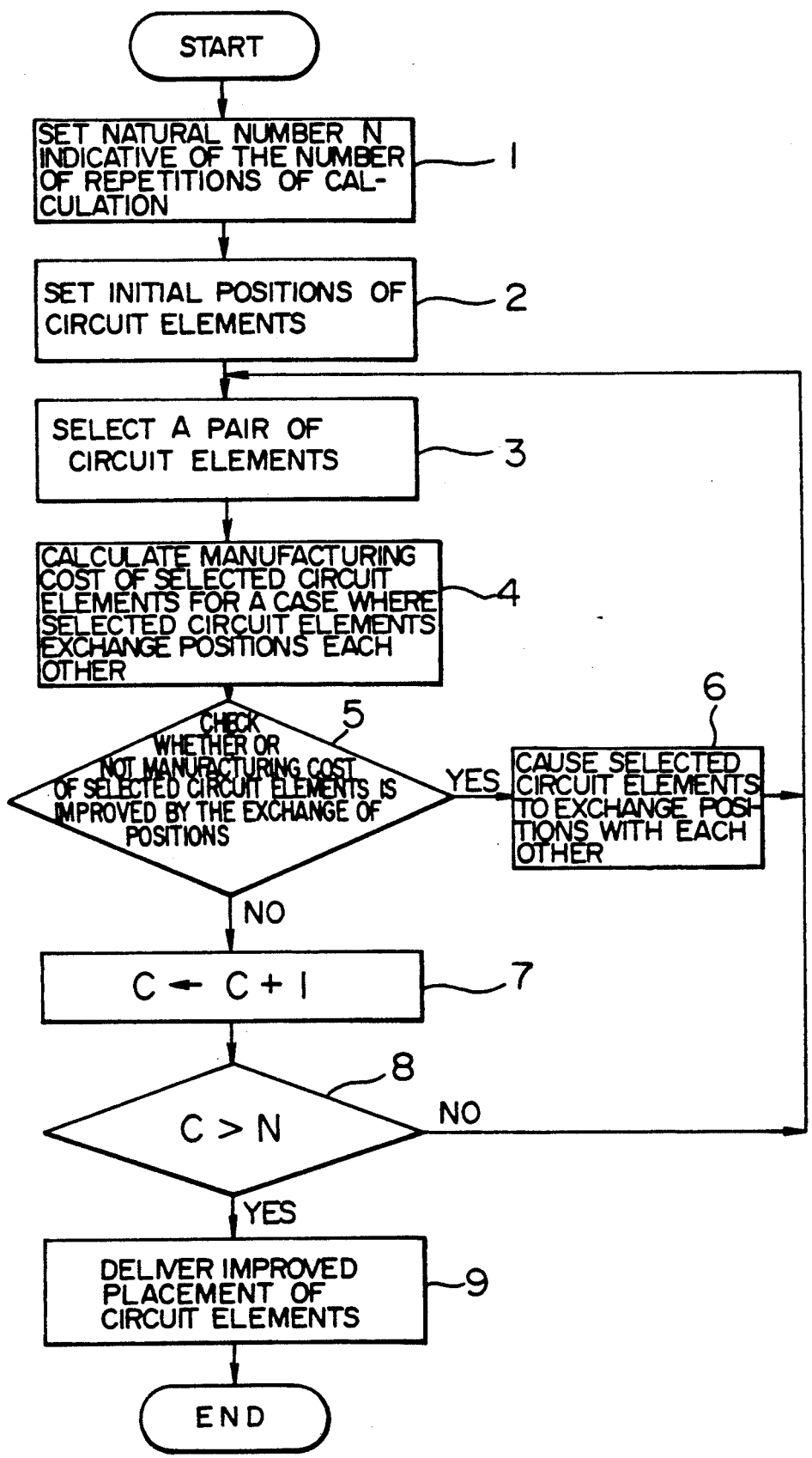
FIG. 1 is a flow chart showing the steps of a procedure used in the conventional iterative improvement method.

Now, embodiments of the present invention will be explained below, with reference to the drawings.

FIG. 2 shows the whole construction of an embodiment of a placement optimizing apparatus according to the present invention which embodiment is included in an apparatus for designing semiconductor devices. Referring to FIG. 2, a placement optimizing apparatus 10 (that is, present embodiment) includes a network initializing part 11, a processor network 12 formed of interconnected processors, and a placement coordinate conversion part 13. In the network initializing part 11, initial values of various data are set, to activate the processor network 12. The results of arithmetic operations performed by the network 12 are sent to the placement coordinate conversion part 13, which delivers the position coordinate of each circuit element on the basis of the results of arithmetic operations performed by the network 12.

FIG. 3 shows the detailed construction of the network initializing part 11. Referring to FIG. 3, the network initializing part 11 includes a connection table 11a, a placement position table 11b, a weight/threshold setting part 11c, and an initial-value-of-output setting part 11d. The connection table 11a stores therein, for example, information on the connection among circuit elements on a LSI, that is, information on which of the circuit elements on the LSI is to be connected to a desired circuit element on the LSI. The placement position table 11b stores therein coordinate values of those positions on the LSI where the circuit elements are to be disposed. The contents of each of the connection table 11a and the placement position table 11b, that is, data stored in each of the tables 11a and 11b is updated by an input value, and the updated data is sent from the tables 11a and 11b to the weight/threshold setting part 11c, which sets weight and threshold factors as will be explained later in detail, on the basis of the information from the tables 11a and 11b, to activate the processor network 12. The initial-value-of-output setting part 11d sets the initial value of the output of each of the processors included in the network 12 to, for example, 0.5, though each processor finally delivers an output equal to "0" or "1". The initial value thus determined is sent to the network 12.

FIG. 4 is a diagram for explaining the processor network 12. As shown in FIG. 4, the network 12 is made up of a processor network part 31 and an output 32. The processor network part 31 includes a large number of processors 31a to 31g, and the processors are connected with one another so that each processor is applied with its own output and the outputs of all other processors. It is to be noted that only a portion of connections among the processors is shown in FIG. 4 for convenience' sake. In the output part 32, output terminals are provided on a one-to-one basis for each processor. For example, in a case where the positions of n circuit elements are calculated, that is, n positions corresponding to n circuit elements are calculated, $n^2$ processors are used for calculation. In this case, it is assumed that $n^2$ processors are placed in the form of an $n \times n$ matrix, and the processor 31a in the find row, the first column is required to perform an arithmetic operation for a case where the first circuit element is allotted to the first position, on the basis of an arithmetic expression mentioned later. Similarly, the processor 31b in the first row, the second column is required to perform an arithmetic operation for a case where the first circuit element is allotted to the second position, the processor 31d in the second row, the first column is required to perform an arithmetic operation for a case where the second circuit element is allotted to the first position, and the processor 31g in the n-th row, the n-th column is required to perform an arithmetic operation for a case where the n-th circuit element is allotted to the n-th position. In short, when the numbers of the circuit elements are indicated by i (where i=1 to n) and the numbers of the positions are indicated by k (where k=1 to n), an arithmetic operation for the combination of a circuit element and a position indicated by (i, k) is performed by a processor having coordinate values (i, k).

Although $n^2$ processors are used in the above explanation, processors, the number of which is less than or equal to $(n^2-1)$, may be used for performing the above arithmetic operations. In this case, the result of an arithmetic operation is stored in a memory, to be used in the following arithmetic operation. Thus, arithmetic operations can be performed in substantially the same manner as a case where the arithmetic operations are performed by $n^2$ processors.

Figure 5:
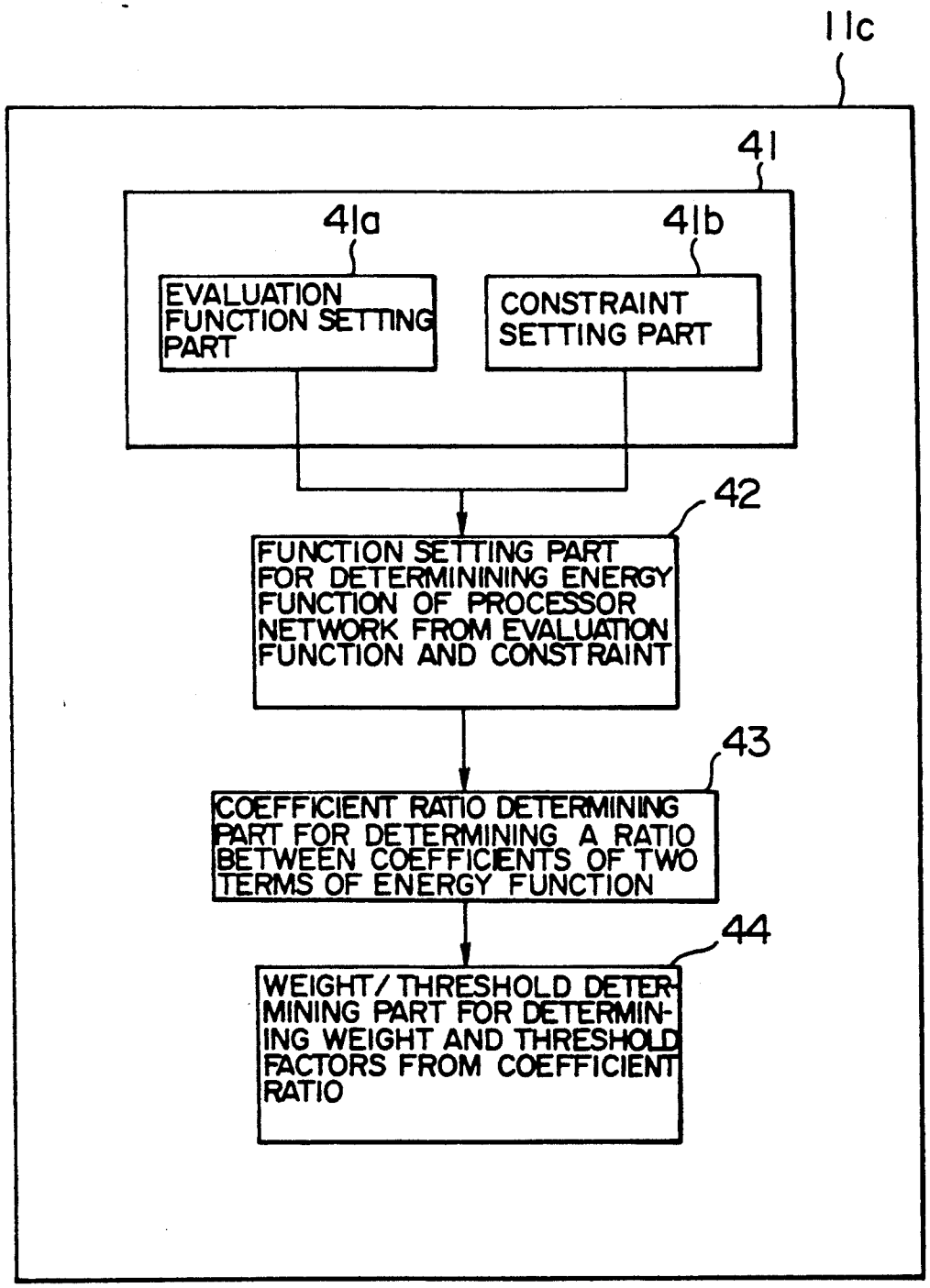
FIG. 5 is a block diagram showing the construction of the weight/threshold setting part of FIG. 3.

FIG. 5 shows the construction of the weight/threshold setting part 11c of FIG. 3. Referring to FIG. 5, the weight/threshold setting part 11c includes an evaluation function setting part 41a, a constraint setting part 41b, a function setting part 42 for determining an energy function from an evaluation function and a constraint condition, a coefficient ratio determining part 43 for determining the ratio between the coefficients of two terms of the energy function, and a weight/threshold determining part 44 for determining a weight factor and a threshold factor from the coefficient ratio.

Prior to the explanation of a method of determining weight and threshold factors, the principle of the optimization technique using a processor network formed of interconnected processors will be explained.

In the above optimization, technique, conditions for minimizing the energy function E of a weighted processor network are calculated. The energy function E is given by the following equation:

$$E = (\tfrac{1}{2})^t x \, T x + {}^t b x$$

where x and b indicate n-dimensional vectors, T an $n \times n$ matrix, and $+X$ and $+b$ transposed vectors. The conditions for minimizing the energy function E are seeked to determine the positions of circuit elements. The above conditions are seeked under constraint that each component $x_i$ of the vector x has a value "0" or "1". It is to be noted that the matrix T is the weight matrix of the processor network, and the vector b is a threshold vector. The term "weight" used in the above description corresponds to the distance to a circuit element, for which an arithmetic operation is performed. The "weight" increases as the above distance is longer. Further, the term "threshold" indicates the probability that a specified circuit element is placed at a specified position, and the threshold increases as the probability that the specified circuit element is placed at the specified position, is higher.

Each processor updates the value of each component $x_i$ of the variable $x$ in accordance with the following equations, to find a minimum value of the energy function E:

$$(du/dt) = -(\partial E/\partial x) = -Tx - b$$

$$x_i = (\tfrac{1}{2})(1 + \tanh u_j)$$

In the above-mentioned optimization technique, the optimal placement of circuit elements is determined from the energy function E thus processed. In the present embodiment, the above optimization technique is executed in the following manner.

First, the evaluation function setting part 41a sets the evaluation function of, for example, an optimization problem that the total wiring length among circuit elements is made as short as possible, as follows:

$$(1/2) \sum_m \sum_{(i,k) \neq (j,l)} d_k c_{ijm} u_{ik} u_{jl} + \sum_i \sum_k \sum_m d_{kp} c_{ipm} u_{ik}$$

where $d_{kl}$ indicates the distance between the k-th position and the l-th position, $d_{kp}$ indicates the distance between the k-th position and the fixed position of the p-th circuit element, $c_{ijm}$ is given by an equation $$c_{ijm} = \begin{cases} 1 & i, j \in M_m \\ 0 & \text{otherwise,} \end{cases}$$

$M_m$ is a net indicative of a connecting relation among circuit elements, i and j indicate circuit elements, p indicates a circuit element whose position is fixed, and $u_{ik}$ and $u_{jl}$ indicate variables.

Next, the constraint setting part 41b sets the constraint conditions of the present optimization problem as follows:

$$u_{ij} \{0, 1\}$$

$$\sum_i u_{ik} = 1 \quad (\forall k)$$

$$\sum_k u_{ik} = 1 \quad (\forall i)$$

The above constraint conditions mean that the placement of a plurality of circuit elements at the same position is forbidden.

The above evaluation function (that is, objective function) and the constraint conditions can be converted into the energy function E of the processor network as follows:

$$E = E_1 + E_2$$

$$E_1 = (1/2)D \left\{ \sum_{i \neq j} \sum_{k \neq l} \sum_m d_k c_{ijm} x_{ik} x_{jl} + \sum_i \sum_k \sum_m d_{kp} c_{ipm} x_{ik} \right\}$$

$$E_2 = A \left\{ \sum_i \left( \sum_k x_{ik} - 1 \right)^2 + \sum_k \left( \sum_i x_{ki} - 1 \right)^2 \right\}$$

The above evaluation function and energy function are used for a case where the position of a specified one of circuit elements which are to be placed, is previously determined on the basis of experience or under constraint conditions. In a case where there is not any circuit element whose position is fixed, the second term of the evaluation function and the second term of the $E_1$-part of the energy function are eliminated.

Next, the coefficient ratio determining part 43 determines a ratio A/D of the coefficient A of the $E_2$-part of the energy function E to the coefficient D of the $E_1$-part.

Now, let us consider a neural network. When the state of a neuron is changed from "0" to "1" or from "1" to "0" in a solution obtained from the neural network, it is sure that the energy function E does not decrease. Accordingly, in order to obtain solutions capable of satisfying constraint conditions, the coefficient ratio A/D is determined so that when the state of any one of neurons is changed from "0" to "1", the value of energy function E due to a solution satisfying the constraint conditions is smaller than the values of energy function E due to other solutions which do not satisfy the constraint conditions. Incidentally, in a case where the state of the neuron is changed from "1" to "0", the above requirement is always satisfied on the basis of the form of the energy function.

Now, explanation will be made of how the ratio A/D is determined. Let us study a change $\Delta E_1$ in $E_1$ and a change $\Delta E_2$ in $E_2$ in a case where a state that the $E_2$-part is made minimum (that is, a state that the constraint conditions are satisfied) is varied by changing the value of the variable $x_{ik}$ from "0" to "1". By using the number N of circuit elements included in the largest one of circuit element nets, the upper limit of $\Delta E_1$ can be written as follows:

$$\Delta E_1 \leq DN \max_{(i,k,j,l)} \left( \sum_m d_k c_{ijm} \right) + D \max_{(i,k,j,l)} \left( \sum_m d_{kp} c_{ipm} \right)$$

$$\Delta E_2 = 2A$$

When the ratio A/D is determined so that a formula $\Delta E_1 \leq \Delta E_2$ is satisfied, the constraint conditions will be satisfied. Further, the placement of circuit elements is improved as the ratio A/D is smaller. Accordingly, an equation $\Delta E_1 = \Delta E_2$ is set, and thus the ratio A/D is given by the following equation:

$$A/D = (1/2) \left\{ N \max_{(i,k,j,l)} \left( \sum_m d_k c_{ijm} \right) + \max_{(i,k,j,l)} \left( \sum_m d_{kp} c_{ipm} \right) \right\}$$

By comparing the coefficients of the energy function thus obtained with the coefficients of the energy function which has been used for explaining the principle of the optimization technique, the determination part 44 determines the weight matrix T and the threshold vector b as follows:

$$T = (T_{ikjl})$$

$$T_{ikjl} = \begin{cases} 0 & (i = j, k = l) \\ 2A & (i \neq j, k = l \text{ or } i = j, k \neq l) \\ D\Sigma d_k c_{ijm} & (i \neq j, k \neq l) \end{cases}$$

$$b = \{b_{ik}\}$$

$$b_{ik} = -2A + D \sum_m d_{kp} c_{ipm} \qquad (Vi)$$

The processor network performs the following arithmetic operations by using the weight matrix T and the threshold vector b, to determine the placement of circuit elements.

That is, in a case where the value of the variable $u_{jl}$ due to the t-th arithmetic operation, that is, $u_{jl}(t)$ is known, the processor having coordinate values (i, k) calculates the value of the variable $u_{ik}$ due to the (t+1)th arithmetic operation, that is, $u_{ik}(t+1)$, by using the following equations:

$$dx_{ik}(t) = -(\Sigma T_{ikjl} u_{jl}(t) - b_{ik}) \times dt$$

$$x_{ik}(t+1) = x_{ik}(t) + dx_{ik}(t)$$

$$u_{ik}(t+1) = 1/\{1 + \exp(-x_{ik}(t+1))\}$$

where dt indicates an integration interval, and is experimentally determined, for example, dt is set to 0.01 sec. In the above arithmetic operation the initial value of the variable $u_{ik}$ is set to 0.5 (that is, $u_{ik}(0) = 0.5$). In a case where the value of the variable $u_{ik}$ at the (t+1)th arithmetic operation does not converge on "0" or "1", the processor takes in its own calculation result at the (t+1)th operation and the calculation results of other processors at the (t+1)th operation, to find $dx_{ik}(t+1)$, and performs the (t+2)th arithmetic operation. By repeating the arithmetic operation as mentioned above, only a single processor in each row (or each column) of the two-dimensional matrix formed of processors, can deliver an output equal to "1", and the remaining processors in each row (or each column) deliver outputs equal to "0". Thus, when the processor having coordinate values (i, k) delivers "1", the i-th circuit element is placed at the k-th position.

Next, explanation will be made of how output signals from the processor network are processed.

Figure 6:
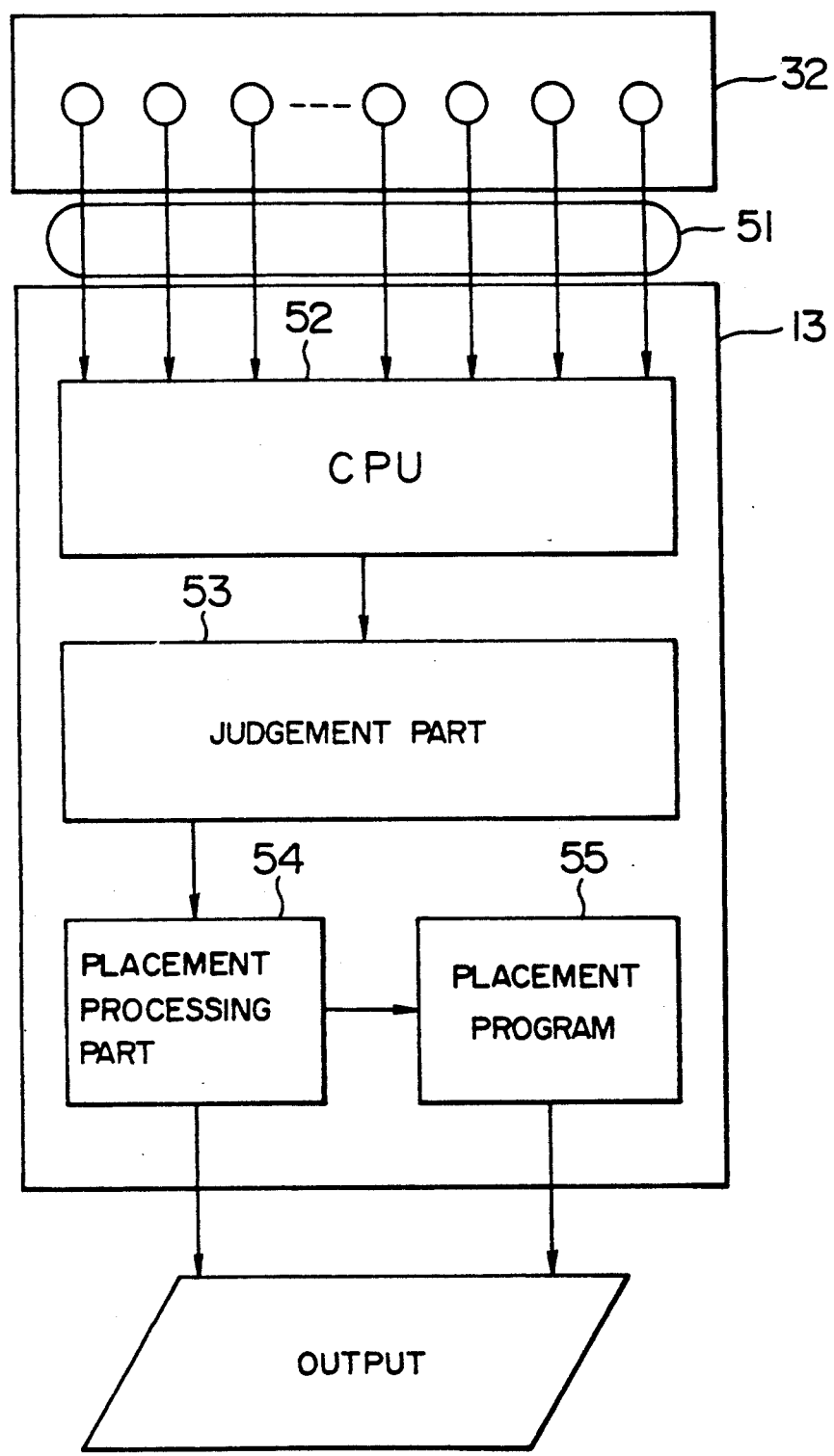
FIG. 6 is a block diagram showing the construction of the placement coordinate conversion part of FIG. 2.

FIG. 6 shows the construction of the placement coordinate conversion part 13. Referring to FIG. 6, the conversion part 13 includes a central processor unit (CPU) 52 which is connected to the output part 32 of the processor network 12 through signal lines 51, a judgement part 53, a placement processing part 54, and a placement program 55.

Each time an arithmetic operation is performed, $n^2$ signals are sent from the processor network 12 to the CPU 52. Before each of the signals converges on a level "0" or "1", each signal has an indefinite level within a range from "0" to "1", for example, a level "0.3" or "0.9". When each signal converges, it has a definite level "0" or "1". The CPU 52 checks whether or not the arithmetic operation performed by the processor network 12 has converged, that is, whether or not the network 12 delivers n signals having the level "1".

When the arithmetic operation performed by the network 12 has converged, signal processing is carried out as mentioned below.

When the ratio A/D is determined as mentioned above, n processors deliver outputs having the level "1", and it is determined from the coordinate values of each of processors having the output level "1" how the circuit elements are to be arranged. In a case where the ratio A/D is set to a value different from the value due to the above-mentioned equation, however, the outputs from the processor network 12 does not converge. The value of the ratio A/D given by the above-mentioned equation is the lower limit of favorable values of the ratio A/D. In some placement problems, the ratio A/D is set to a value which is smaller or greater than the low limit, and thus there is a fear that some of the output signals from the processor network 12 do not converge. In such a case, it is necessary to stop the arithmetic operation by the network 12 on the way, and to determine the placement of circuit elements from the output signals of the network 12 due to the last arithmetic operation.

The CPU 52 produces information necessary for the judgement part 53 from the outputs signal of the network 12, by calculation mentioned later. On the basis of the above information, the judgement part 13 judges whether or not circuit elements can be placed in accordance with the outputs of the network 12. When a circuit element can be placed, that is, when the outputs of the processors allotted to the circuit element converge, the placement processing part 54 determines the position of the circuit element. When it is judged that some circuit elements cannot be placed, that is, when the outputs of the processors allotted to the circuit elements do not converge, only circuit elements which are judged to be arrangeable, are placed, and the positions of the remaining circuit elements which are judged not to be arrangeable, are determined by the conventional iterative improvement method or simulated annealing method.

Figure 7:
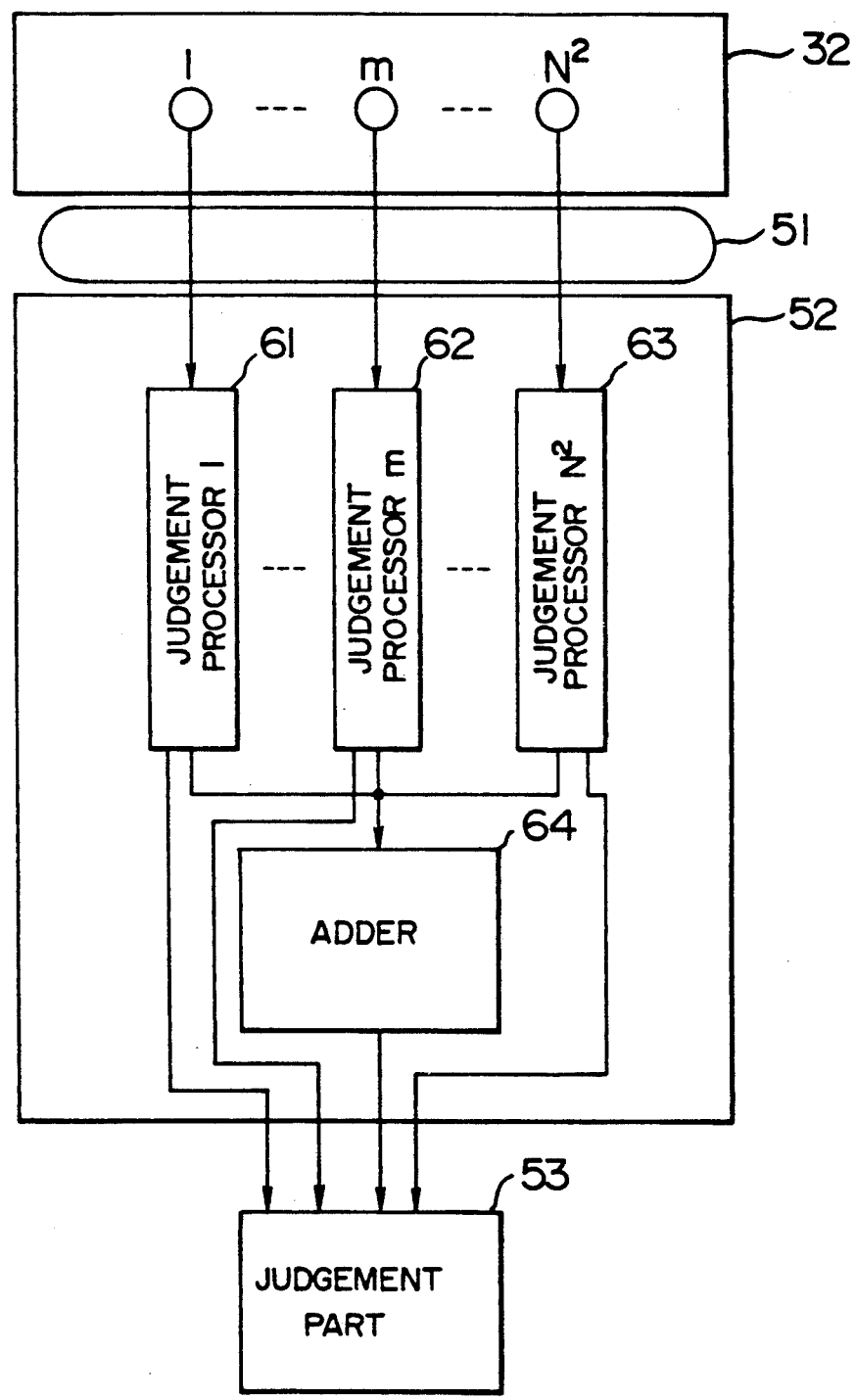
FIG. 7 is a block diagram showing the construction of the central processing unit (CPU) of FIG. 6.

FIG. 7 shows the construction of the CPU 52. In a case where n circuit elements are placed at n positions, $n^2$ signals are delivered from the network 12.

In the present embodiment, the CPU 52 includes $n^2$ judgement processors. It is to be noted that only three judgement processors 61, 62 and 63 are shown for the sake of brevity. The output signals from the network are applied to corresponding judgement processors. Each judgement processor calculates information for judging whether the input signal thereto converges or not, independently of other judgement processors, and delivers the result of calculation to the judgement part 53 and the adder 64. The adder 64 adds up the input signals thereto as mentioned later, and delivers the result of addition to the judgement part 53. It is to be noted that the CPU 52 includes $n^2$ judgement processors to carry out parallel processing, thereby shortening a processing time. Alternatively, only a single high-speed processor may be included in the CPU 52, to carry out serial processing.

Figure 8:
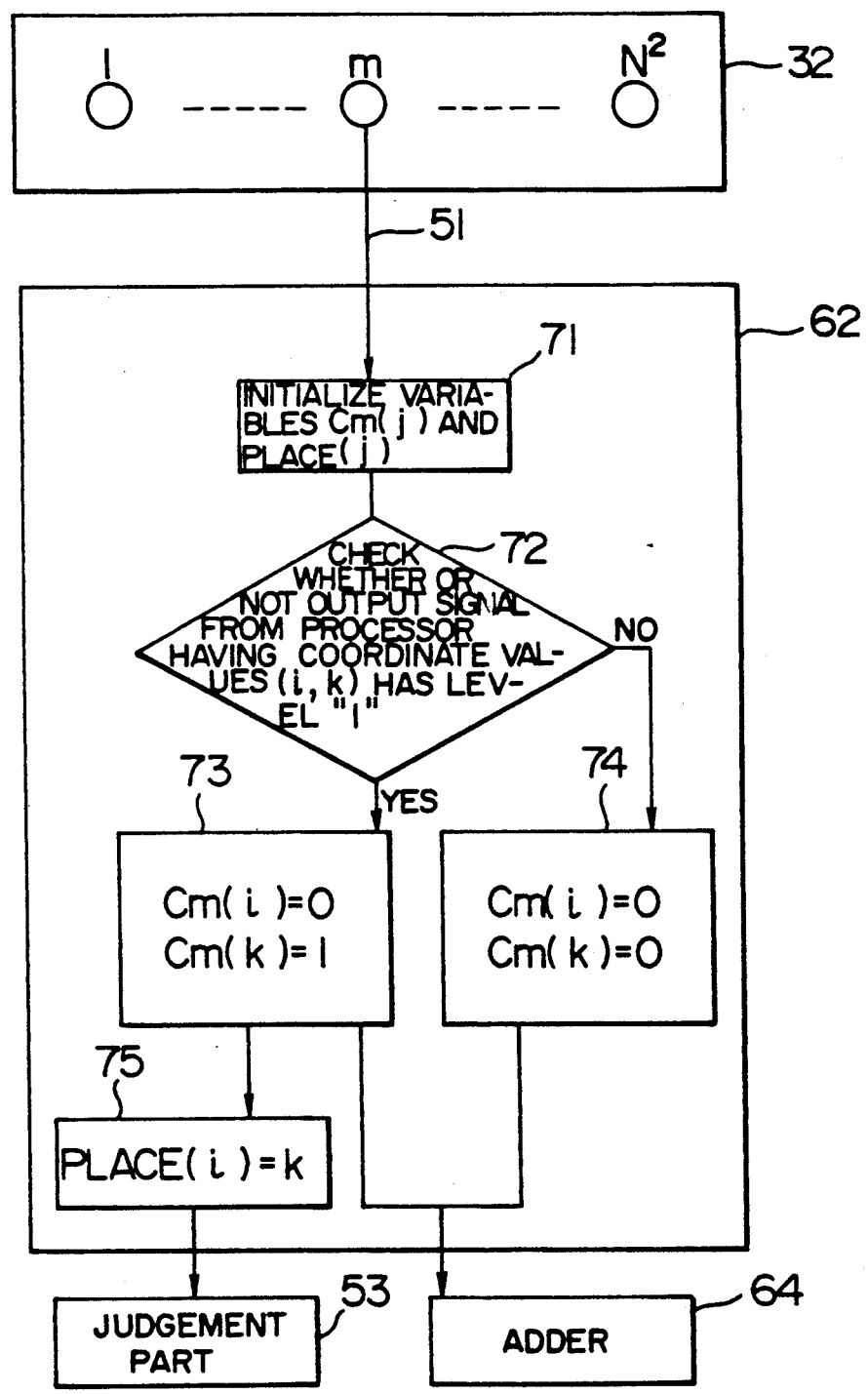
FIG. 8 is a flow chart which shows processing carried out by the judgement processor of FIG. 7.

FIG. 8 shows the processing carried out by each judgement processor of FIG. 7. Referring to FIG. 8, variables $C_m(j)$ and PLACE(j) (where j=1 to $n^2$) are initialized, that is, these variables are set to "0" (step 71). Then, it is checked whether or not the output signal from the processor which has coordinate values (i, k) and is connected to the m-th judgement processor, has a level "1" (step 72). When the output signal has the level "1", variables $C_m(i)$ and $C_m(k)$ are set to "1" (step 73), and the variable PLACE(i) is set to "k". The above values of these variables are sent to the judgement part 53. When it is judged in the step 72 that the output signal does not converge on the level "1", the values of the variables $C_m(\lambda)$ and $C_m(k)$ are kept at "0" (step 74). The values obtained in the step 73 or 74 are sent to the adder 64.

Figure 9:
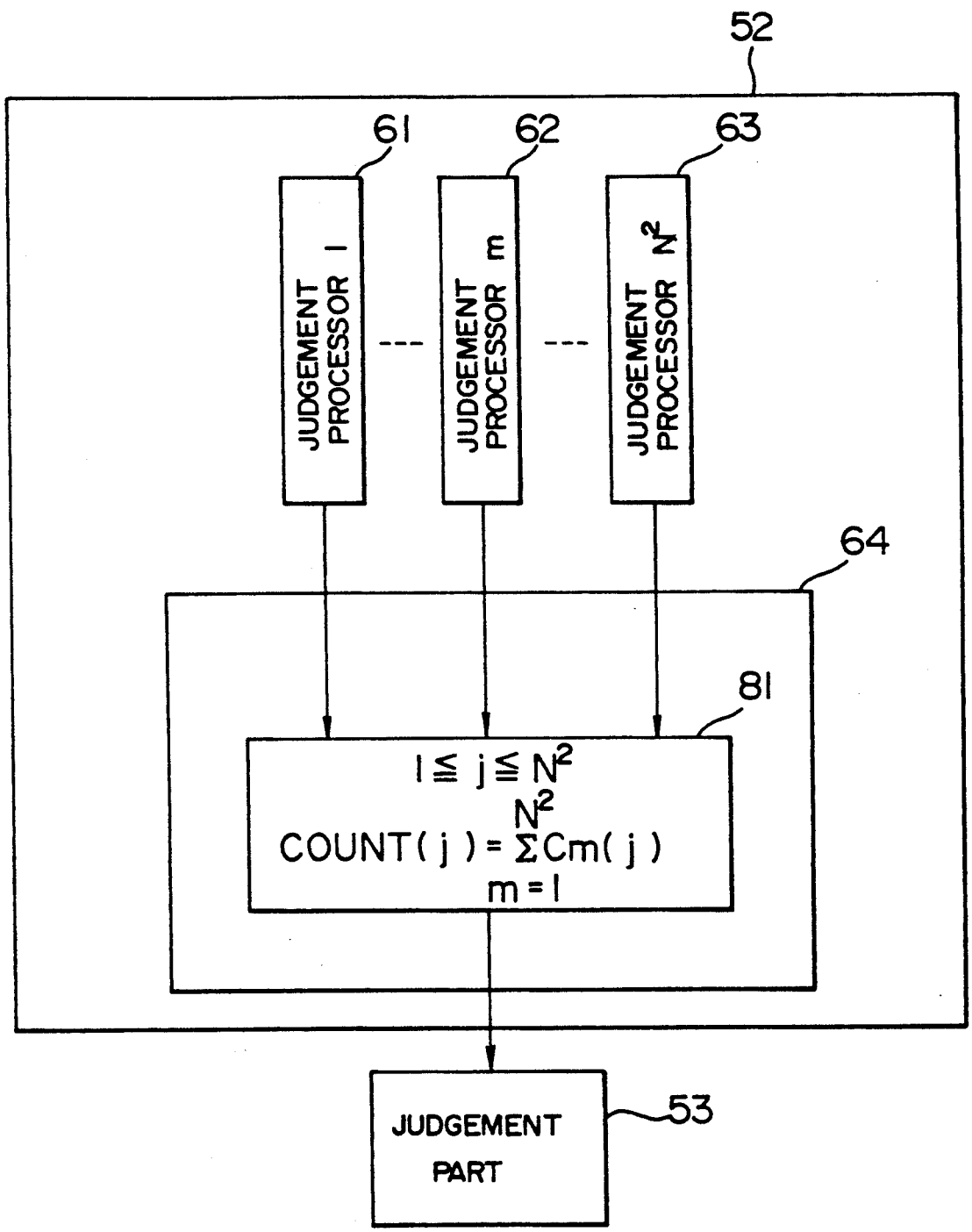
FIG. 9 is a block diagram explaining the operation the adder of FIG. 7.

FIG. 9 is a diagram for explaining the operation of the adder 64. In the adder 64, the values of the variables $C_m(j)$ supplied from all the judgement processors are summed up, to form a variable COUNT(j) which is given by the following equation:

$$COUNT(j) = \sum_{m=1}^{n^2} C_m(j)$$

The value of the variable COUNT(j) is sent to the judgement part 53.

Figure 10:
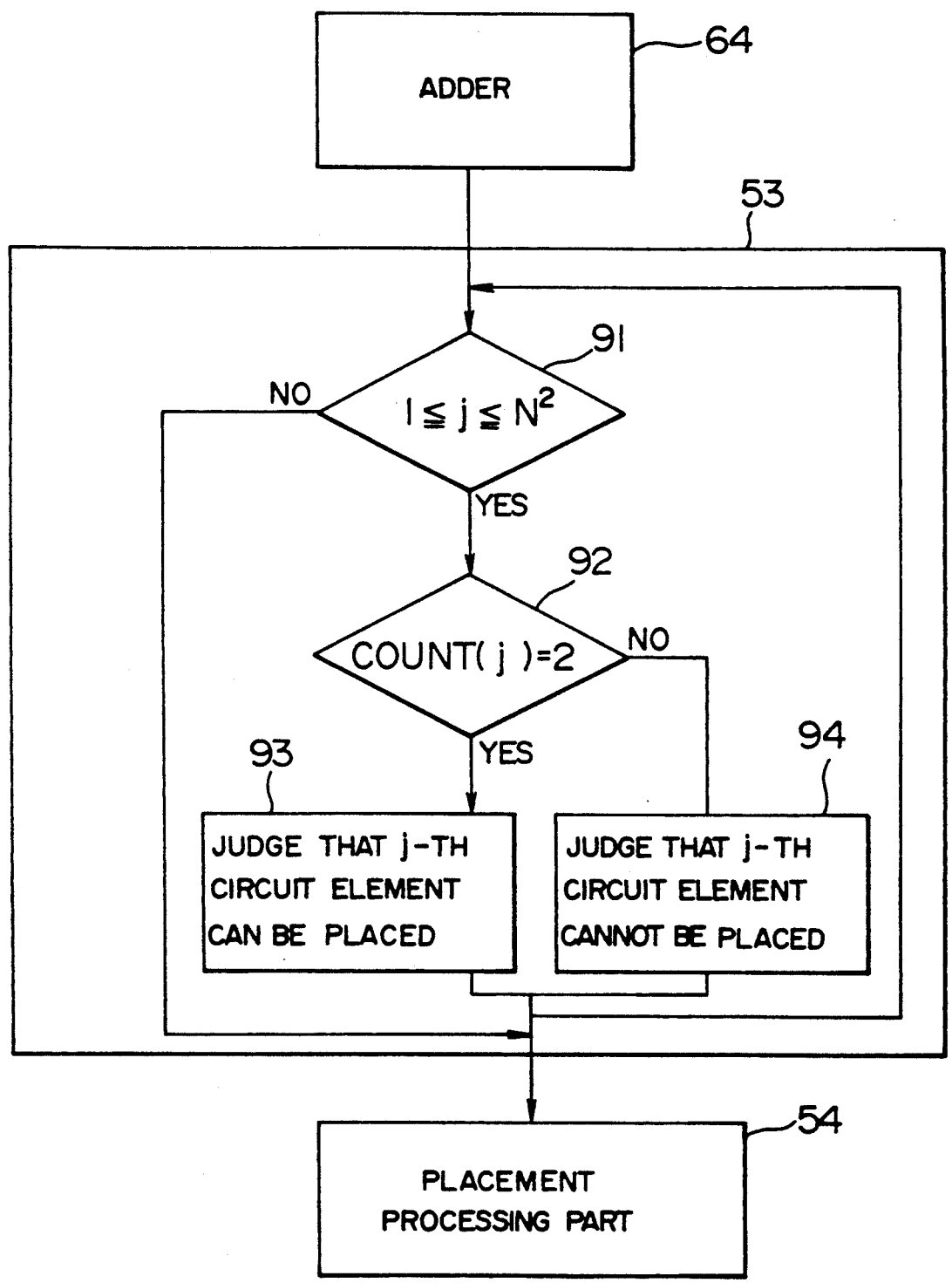
FIG. 10 is a flow chart which shows processing carried out by the judgement part of FIG. 6.

FIG. 10 is a diagram for explaining the operation of the judgement part 53. The value of the variable COUNT(j) supplied from the adder 64 will first be explained. Let us consider a case where that one of processors for forming the network 12 which delivers an output having a value "1", has coordinate values (i, k). In this case, the values of diagonal components (i, i) and (k, k) of the n×n zero-matrix are set to "1". This operation is performed for all of processors which deliver the output having the value "1". Thus, when the outputs of all of the processors for forming the network 12 converge, all the diagonal components of the matrix are set to "2". In other words, a circuit element corresponding to the diagonal component which is set to "2", can be placed.

The value of the variable COUNT(i) is the value of the diagonal component (i, i). Accordingly, the judgement part 53 carries out the following processing. That is, it is checked whether the value j lies in a range from 1 to $n^2$ (step 91). When the value j lies in this range, it is checked whether or not the value of the variable COUNT(j) is equal to "2" (step 92). It is judged that the j-th circuit element corresponding to the variable COUNT(j) equal to "2" can be placed (step 93). While, it is judged that the j-th circuit element corresponding to the variable COUNT(j) different from "2" cannot be placed. The judgement part 53 delivers the result of judgement to the placement processing part 54.

Figure 11:
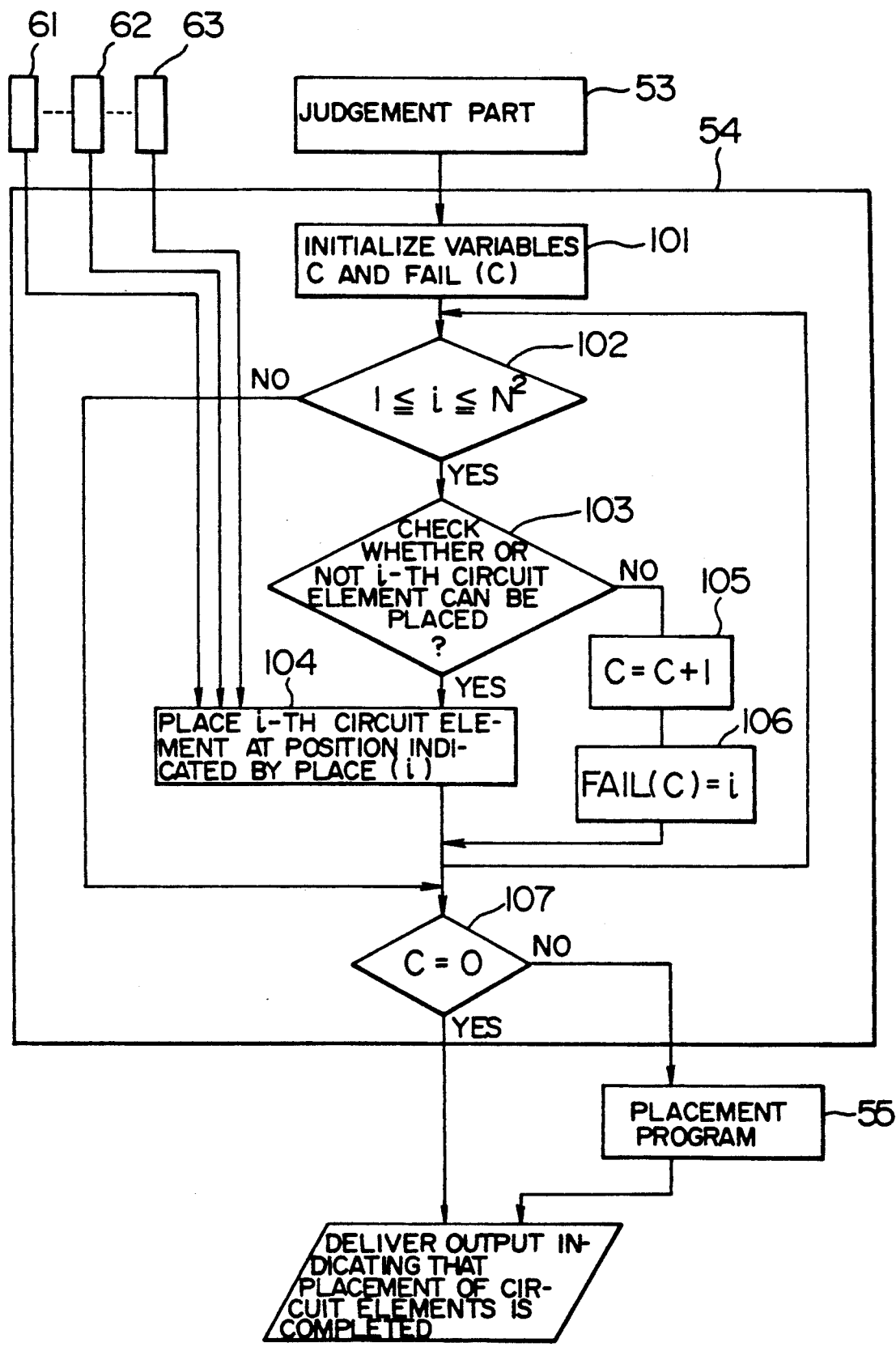
FIG. 11 is a flow chart which shows processing carried out by the placement processing part of FIG. 6.

FIG. 11 is a flow chart for explaining the operation of the placement processing part 54. When the result of judgement indicating whether the i-th circuit element can be placed or not, is sent from the judgement part 53 to the placement processing part 54, a variable C indicating the number of circuit elements which cannot be placed, and a variable FAIL(C) indicating the number of the circuit element which could not be placed, are both initialized, that is, the values of these variables are set to "0". Next, the following processing is carried out for $n^2$ judgemental results. That is, it is checked whether or not the i-th circuit element can be placed. When the i-th circuit element can be placed, the i-th circuit element is placed at the position indicated by the value of the variable PLACE(i) supplied from a judgement processor. When it is judged that the i-th circuit element cannot be placed, the value of the variable C is incremented by one, and the value of the variable FAIL(C) is set to "i". The above processing is carried out for all the circuit elements. When the value of the variable C indicating the number of circuit elements which cannot be placed, is equal to "0", the placement of all the circuit elements is completed. When there are circuit elements which cannot be placed, the conventional iterative improvement method or simulated annealing method is applied for the circuit elements, to determine the positions of the circuit elements.

Figure 12:
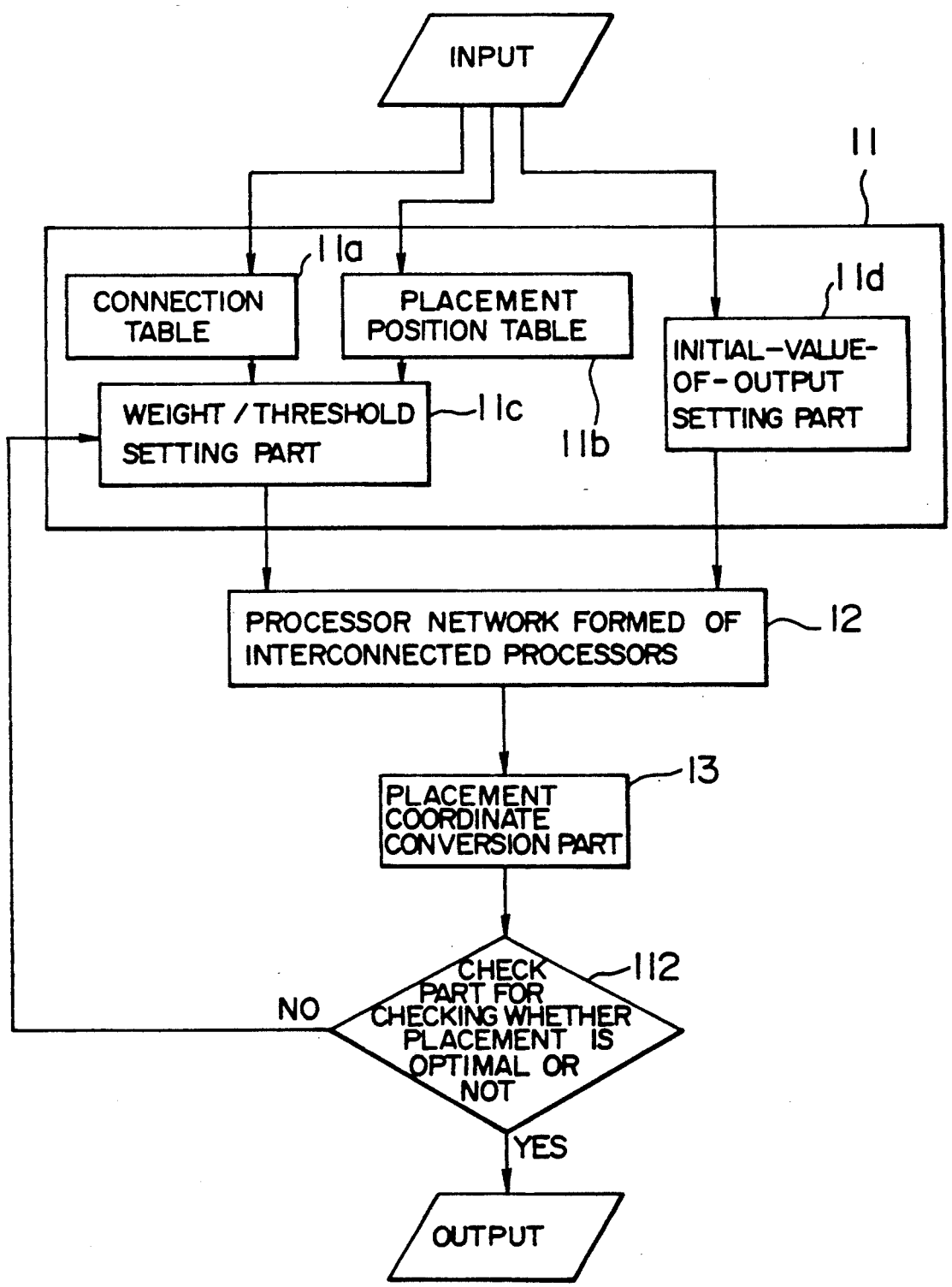
FIG. 12 is a block diagram showing the whole construction of another embodiment of a placement optimizing apparatus according to the present invention.

FIG. 12 shows the whole construction of another embodiment of a placement optimizing apparatus according to the present invention. The present embodiment is different from the embodiment of FIG. 2 in that, when the output of the placement coordinate conversion part 13 does not indicate the optimal placement, the processing in step 112 is repeated to find the optimal placement. The present embodiment will be explained below.

In a case where some of the outputs from the processor network do not converge on a value "1" or "0", the positions of circuit elements corresponding to such outputs, as mentioned above, are determined by the conventional exchange method (namely, interative improvement method or simulated annealing method. Thus, the positions of all the circuit elements can be determined. However, the placement thus obtained does not always indicate the optimal placement, but may correspond to a local minimum of the energy function. That is, it is impossible to judge whether the above placement is optimal or corresponds to the local minimum. In some cases, however, it is experimentally known that the above placement is not optimal. In such cases, the optimal placement of circuit elements can be found by repeating the arithmetic operation of the processor network in such a manner that the diagonal components of the weight matrix T are increased.

The weight matrix $T_{ikjl}$ is defined so that components indicated by (i=j) and (k=l), that is, all the diagonal components have a value "0". It is mathematically known that the placement of circuit elements which is determined by using the above weight matrix, corresponds to the local minimum.

When the position of the i-th circuit element which cannot be arranged, is determined by the conventional exchange method or the like, the output of the processor corresponding to the above position is set to "1", and the outputs of other processors allotted to the i-th circuit element are set to "0". Further, the values of those diagonal components of the weight matrix T which correspond to the coordinate values of processors having the output "1", are increased to, for example, 0.1 or 0.3. Then, the network 12 recalculates the variable $u_{ik}$ by using the weight matrix which has the increased diagonal components, till the variable $u_{ik}$ converges on a value "0" or "1". When the placement thus obtained agrees with the original placement (that is, the placement determined by using the exchange method or the like), the original placement indicates the optimal placement. When the original placement corresponds to a local minimum, the placement obtained by using the modified weight matrix, is different from the original placement. Thus, the optimal placement can be obtained by repeating the processing in the parts 11c, 12, 13, 112 of FIG. 12.

The above-mentioned embodiments show a case where the present invention is applied to the placement of circuit elements on a LSI. However, the present invention is not limited to the above case, but is applicable to a case where a multiplicity of circuit modules having correlation with one another are placed on a single printed circuit board.

As has been explained in the foregoing, according to the present invention, a layout indicating the optimal circuit placement can be obtained at high speed. Further, a semiconductor device which is designed and fabricated by a placement method according to the present invention, is low in manufacturing cost and can operate at high speed.

What is claimed is:

1. A method of determining optimal allocation of a multiplicity of circuit elements having a predetermined correlation with one another, comprising the steps of:

setting at least information for connecting the circuit elements and coordinates for arranging the circuit elements;

generating output values for allocating the circuit elements by executing operation in $n^2$ processors, each of which receives its own output and outputs of the other processors to substantially arrange the circuit elements on locations on the basis of a weight representing a degree of connection between the circuit elements and on the basis of a threshold representing an allocation possibility of the circuit elements on the locations, both the weight and the threshold being obtained from the information and the coordinates;

calculating a constraint variable in a processor of the coordinates value (i, k) such that an i-th circuit element (where i=1 to n) is arranged on a k-th location (where k=1 to n), so that a circuit evaluation function becomes an optimal value and converges up to a constraint condition; and arranging a circuit element on the coordinates of one of the processor which generates an output value which converges the constraint variable to the constraint condition, by deciding whether the constraint variable is converged or not.

2. A method according to claim 1, wherein processors, the number of which is less than or equal to $(n^2-1)$, are used, each processor calculates constraint variables by serial processing, the result of calculation is stored in a memory, and the next calculation is carried out by using the result of calculation stored in the memory, to calculate constraint variable in a manner similar to the calculation in a case where $n^2$ processors are used.

3. A method according to claim 1, wherein the processors are connected to form a neural network.

4. A method of determining optimal allocation of a multiplicity of circuit elements having a predetermined correlation with one another, comprising the steps of:

setting at least information for connecting the circuit elements and coordinates for arranging the circuit elements;

generating output values for allocating the circuit elements by executing operation in $n^2$ processors, each of the processors receiving its own output and outputs of the other processors to substantially arrange the circuit elements on locations on the basis of a weight matrix T representing a degree of connection between the circuit elements and on the basis of a threshold vector b representing an allocation possibility of the circuit elements on the locations, both the weight matrix T and the threshold vector b being based on the information and the coordinates and obtained from an energy function E given by the following equations:

$$E = (1/2)^t xTx + {}^t bx$$
$$= E_1 + E_2$$

$$E_1 = (1/2)D\left( \sum_{i \neq j} \sum_{k \neq l} \sum_m d_{kl} c_{ijm} x_{ik} x_{jl} + \sum_i \sum_k \sum_m d_{kp} c_{ipm} x_{ik} \right)$$

$$E_2 = A\left\{ \sum_i \left( \sum_k x_{ik} - 1 \right)^2 + \sum_k \left( \sum_i x_{ik} - 1 \right)^2 \right\}$$

where x and b indicate n-dimensional vectors, $t_x$ indicates the transposed vector of the vector x, $t_b$ indicates the transposed vector of the vector b, $d_{kl}$ indicates the distance between the k-th position and the l-th position, $d_{kp}$ indicates the distance between the k-th position and the fixed position of the p-th circuit element (wherein, when there is no fixed circuit element, $d_{kp}=0$), $c_{ijm}$ indicates a variable having a value "1" for a case where the i-th and j-th circuit elements form a net and having a value "0" for other cases, $x_{ik}$ and $x_{jl}$ indicate constraint variables, and A and D are coefficients, wherein the weight matrix T and threshold vector b thus determined are given by the following equations:

$$T_{ikjl} = \begin{cases} 0 & (i = j, k = l) \\ 2A & (i \neq j, k = l \text{ or } i = j, k \neq l) \\ D\Sigma d_k c_{ijm} & (i \neq j, k \neq l) \end{cases}$$

$$b_{ik} = -2A + D\Sigma d_{kp} c_{ipm} \quad \text{(VI)}$$

calculating a constraint variable in a processor of the coordinates value (i, k) such that an i-th circuit element (where i=1 to n) is arranged on a k-th location (where k=1 to n), from the following equations:

$$dx_{ik}(t) = -(\Sigma T_{ikjl} u_{jl}(t) - b_{ik}) \times dt$$

$$x_{ik}(t+1) = x_{ik}(t) + dx_{ik}(t)$$

$$u_{ik}(t+1) = 1/\{1 + exp(-x_{ik}(t+1))\}$$

where a constraint variable $u_{jl}(t)$ of the t-th calculation result is given, a constraint variable $u_{ik}(t+1)$ is given by t+1-th calculation, and calculating the constraint variable $u_{ik}$ becoming convergent up to the following constraint condition:

$$u_{ik} \epsilon \{0, 1\}$$

$$\sum_i u_{ik} = 1$$

$$\sum_k u_{ik} = 1; \text{ and}$$

arranging a circuit element on the coordinates of one of the processors which generates an output value which converges the constraint variable to the constraint condition, by deciding whether the constraint variable s converged or not.

5. A method according to claim 4, wherein the weight matrix T and the threshold vector b are determined by using a ratio A/D which is given by the following equation:

$$A/D = (1/2)N\left\{ \MAX_{(i,k,j,l)}\left(\sum_m d_k c_{ijm}\right) + \MAX_{(i,k,j,l)}\left(\sum_m d_{kp} c_{ipm}\right) \right\}$$

where N indicates the number of circuit modules or elements included in the maximal net.

6. A method according to claim 4, wherein the weight matrix T and the threshold vector b are determined by using a value of the ratio A/D which is smaller than the value of the ratio A/D given by the following equation:

$$A/D = (1/2)N\left\{ \MAX_{(i,k,j,l)}\left(\sum_m d_k c_{ijm}\right) + \MAX_{(i,k,j,l)}\left(\sum_m d_{kp} c_{ipm}\right) \right\}$$

where N indicates the number of circuit modules or elements included in the maximal net.

7. A method according to claim 6, wherein when the outputs of processors allotted to a circuit module or element cannot satisfy the constraint conditions, the position of the circuit module or element is determined by one of the exchange method and the simulated annealing method.

8. A method according to claim 7, wherein those diagonal components of the weight matrix which correspond to the position of the circuit module or element determined by one of the exchange method and the simulated annealing method, are incremented by a value within a range from 0 to 1, and the constraint variable $u_{ik}$ is recalculated by using the modified weight matrix to find the optimal position of the circuit module or element.

9. A method according to claim 4, wherein the initial value of the constraint variable $u_{ik}$ is set to a value within a range from 0 to 1.

10. A method according to claim 9, wherein the initial value of the constraint variable $u_{ik}$ is set to 0.5.

11. A method according to claim 4, wherein the processors are connected to form a neural network.

12. An optimal allocation apparatus for allocating a multiplicity of circuit elements having a predetermined correlation with one another, comprising:
initialization means including at least a table storing information for connecting between the circuit elements and a table storing coordinates for arranging the circuit elements, for setting a weight representing a degree of connection between the circuit elements and a threshold representing an allocation possibility of the circuit elements on locations on the basis of the information and the coordinates;
processor network means including $n^2$ processors, each of the processors receiving its own output and outputs of the other processors to generate an output value on the basis of the weight and the threshold by executing calculation to substantially arrange the circuit elements on the locations such that a processor of the coordinates value (i, k) calculates a constraint variable in arranging an i-th circuit element (where i=1 to n) on a k-th location (where k=1 to n), so that a circuit evaluation function becomes an optimal value and converges up to a constraint condition; and
arrangement means for arranging a circuit element on the coordinates of the processor which generates an output value which converges the constraint variable to the constraint condition, by deciding whether the constraint variable is converged or not.

13. An apparatus according to claim 12, wherein processors, the number of which is less than or equal to ($n^2-1$), are included in the processor network, a memory is additionally provided for storing the result of calculation, each processor calculates constraint variables by serial processing, the result of calculation is stored in the memory, and the next calculation is carried out by using data stored in the memory, to calculate constraint variables in a manner similar to the calculation in a case where $n^2$ processors are included in the processor network.

14. An optimal allocation apparatus according to claim 12, wherein the processors are interconnected to form a neural network.

15. An optimal allocation apparatus for allocating a multiplicity of circuit elements having a predetermined correlation with one another, comprising:
initialization means including at least a table storing information for connecting between the circuit elements and a table storing coordinates for arranging the circuit elements, for setting a weight matrix representing a degree of connection between the circuit elements and a threshold vector representing an allocation possibility of the circuit elements on locations on the basis of the information and the coordinates, both the weight matrix T and the threshold vector b being based on the information and the coordinates and obtained from an energy function E given by the following equation:

$$E = (1/2)^t xTx + {}^t bx$$
$$= E_1 + E_2$$

$$E_1 = (1/2)D\left\{ \sum_{i\neq j}\sum_{k\neq l}\sum_m d_k c_{ijm} x_{ik} x_{jl} + \sum_i\sum_k\sum_m d_{kp} c_{ipm} x_{ik} \right\}$$

$$E_2 = A\left\{ \sum_i\left(\sum_k x_{ik} - 1\right)^2 + \sum_k\left(\sum_i x_{ik} - 1\right)^2 \right\}$$

where x and b indicate n-dimensional vectors, $t_x$ indicates the transposed vector of the vector x, $t_b$ indicates the transposed vector of the vector b, $d_{kl}$ indicates the distance between the k-th position and the l-th position, $d_{kp}$ indicates the distance between the k-th position and the fixed position of the p-th circuit module or element (wherein, when there is no fixed circuit element, $d_{kp}=0$), $c_{ijm}$ indicates a variable having a value "1" for a case where the i-th and j-th circuit elements form a net and having a value "0" for other cases, $x_{ik}$ and $x_{jl}$ indicate constraint variables, and A and D are coefficients, wherein the weight matrix T and threshold vector b thus determined are given by the following equations:

$$T_{ikjl} = \begin{cases} 0 & (i=j, k=l) \\ 2A & (i\neq j, k=l \text{ or } i=j, k\neq l) \\ D\Sigma d_k c_{ijm} & (i\neq j, k\neq l) \end{cases}$$

-continued $$b_{ik} = -2A + D\Sigma d_{kp}c_{ipm}; \quad \text{(Vi)}$$

processor network means including $n^2$ processors, each of the processors receiving its own output and outputs of the other processors to generate an output value for allocating the circuit elements on the basis of the weight matrix T and on the basis of the threshold vector b by executing calculation to substantially arrange the circuit elements on the locations such that a processor of the coordinates value (i, k) calculates a constraint variable in arranging an i-th circuit element (where i=1 to n) on a k-th location (where k=1 to n), so that a circuit evaluation function becomes an optimal value and converges up to a constraint condition, the calculation of the constraint variable being obtained from the following equations:

$$dx_{ik}(t) = -(\Sigma T_{ikj}u_j(t) - b_{ik}) \times dt$$
$$x_{ik}(t+1) = x_{ik}(t) + dx_{ik}(t)$$
$$u_{ik}(t+1) = 1/\{1 + \exp(-x_{ik}(t+1))\}; \text{ and}$$

arrangement means for arranging a circuit element on the coordinates of one of the processor which generates an output value which converges the constraint variable to the constraint condition, by whether the constraint variable is converged or not.

16. An apparatus according to claim 15, wherein the weight matrix T and the threshold vector b are determined by using a ratio A/D which is given by the following equation:

$$A/D = (1/2)N\left\{ \underset{(i,k,j,l)}{\text{MAX}}\left(\underset{m}{\Sigma} d_k c_{ijm}\right) + \underset{(i,k,j,l)}{\text{MAX}}\left(\underset{m}{\Sigma} d_{kp}c_{ipm}\right) \right\}$$

where N indicates the number of circuit modules or elements included in the maximal net.

17. An apparatus according to claim 15, wherein the weight matrix T and the threshold vector b are determined by using a value of the ratio A/D which is smaller than the value of the ratio A/D given by the following equation:

$$A/D = (1/2)N\left\{ \underset{(i,k,j,l)}{\text{MAX}}\left(\underset{m}{\Sigma} d_k c_{ijm}\right) + \underset{(i,k,j,l)}{\text{MAX}}\left(\underset{m}{\Sigma} d_{kp}c_{ipm}\right) \right\}$$

where N indicates the number of circuit modules or elements included in the maximal net.

18. An apparatus according to claim 17, further comprising means for determining the position of a circuit module or element, processors allotted to which fail to deliver outputs capable of satisfying a constraint condition, by one of the exchange method and the simulated annealing method.

19. An apparatus according to claim 18, further comprising means for setting those diagonal components of the weight matrix which correspond to the position of the circuit module or element determined by one of the exchange method and the simulated annealing method, to a value within a range from 0 to 1, and for recalculating the following equations:

$$dx_{ik}(t) = -(\Sigma T_{ikj}u_j(t) - b_{ik}) \times dt$$
$$x_{ik}(t+1) = x_{ik}(t) + dx_{ik}(t)$$
$$u_{ik}(t+1) = 1/\{1 + \exp(-x_{ik}(t+1))\}$$

20. An apparatus according to claim 15, further comprising initial-value setting means for setting the initial value of the variable $u_{jl}$ to a value within a range from 0 to 1.

21. An apparatus according to claim 20, wherein the initial-value setting means sets the initial value of the variable $u_{jl}$ to 0.5.

22. An apparatus according to claim 15, wherein processors, the number of which is less than or equal to $(n^2-1)$, are included in the processor network, a memory is additionally provided for storing the result of calculation, such processor calculates constraint variables by serial processing, the result of calculation is stored in the memory, and the next calculation is carried out by using data stored in the memory, to calculate constraint variables in a manner similar to the calculation in a case where $n^2$ processors are included in the processor network.

23. An optimal allocation apparatus according to claim 15, wherein the processors are interconnected to form a neural network.

24. A semiconductor device design apparatus for use in design of semiconductor devices, comprising:
initialization means including at least a table storing information for connecting between the circuit elements and a table storing coordinates for arranging the circuit elements, for setting a weight representing a degree of connection between the circuit elements and a threshold representing an allocation possibility of the circuit elements on locations on the basis of the information and the coordinates:
processor network means including $n^2$ processors, each of the processors receiving its own output and outputs of the other processors to generate an output value for allocating the circuit elements on the basis of the weight and the threshold by executing calculation to substantially arrange the circuit elements on the locations such that a processor of the coordinates value (i, k) calculates a constraint variable in arranging an i-th circuit element (where i=1 to n) on a k-th location (where k=1 to n), so that a circuit evaluation function becomes an optimal value and converges up to a constraint condition; and
arrangement means for arranging a circuit element on the coordinates of one of the processor which generates an output value which converges the constraint variable to the constraint condition, by deciding whether the constraint variable is converged or not.

25. A semiconductor device design apparatus according to claim 24, wherein the processors are interconnected to form a neural network.

* * * * *